United States Patent
Tomoda et al.

(10) Patent No.: US 8,101,457 B2
(45) Date of Patent: Jan. 24, 2012

(54) MOUNTING METHOD, MOUNTED STRUCTURE, MANUFACTURING METHOD FOR ELECTRONIC EQUIPMENT, ELECTRONIC EQUIPMENT, MANUFACTURING METHOD FOR LIGHT-EMITTING DIODE DISPLAY, AND LIGHT-EMITTING DIODE DISPLAY

(75) Inventors: Katsuhiro Tomoda, Kanagawa (JP); Masato Doi, Kanagawa (JP); Toshiya Takagishi, Kanagawa (JP); Toshiaki Kanemitsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 147 days.

(21) Appl. No.: 12/373,479

(22) PCT Filed: Jun. 25, 2007

(86) PCT No.: PCT/JP2007/062724
§ 371 (c)(1),
(2), (4) Date: Jan. 12, 2009

(87) PCT Pub. No.: WO2008/007535
PCT Pub. Date: Jan. 17, 2008

(65) Prior Publication Data
US 2009/0290337 A1 Nov. 26, 2009

(30) Foreign Application Priority Data
Jul. 12, 2006 (JP) .................................. 2006-191365

(51) Int. Cl.
*H01L 21/00* (2006.01)
(52) U.S. Cl. .............. 438/106; 438/15; 438/26; 438/27; 438/28; 257/E21.499; 257/E33.056

(58) Field of Classification Search ................... 438/15, 438/26–28, 55–57, 64, 65, 106; 257/E21.499, 257/E33.056
See application file for complete search history.

(56) References Cited

U.S. PATENT DOCUMENTS 4,781,775 A 11/1988 Reed et al.
(Continued)

FOREIGN PATENT DOCUMENTS

JP 01-503424 11/1989
(Continued)

OTHER PUBLICATIONS

Japanese Office Action dated Apr. 12, 2011 for corresponding Japanese Application No. 2006-191365.

*Primary Examiner* — Alexander Ghyka
*Assistant Examiner* — Leonard Chang
(74) *Attorney, Agent, or Firm* — K&L Gates LLP

(57) ABSTRACT

Provided is a mounting method making it possible to, when an object such as an element, or more particularly, a microscopic object is mounted on a substrate, achieve mounting readily and reliably with high positional precision by: forming an element holding layer 12, which is made of a material whose viscosity can be controlled, on a substrate 11; controlling the viscosity of a first part 12a of the element holding layer 12, which includes a mounting region for an element, into a viscosity making the element naturally movable, and controlling the viscosity of a second part 12b of the element holding layer 12 outside the first part 12a into a viscosity making the element naturally immovable; and after mounting one element 13 in the first part 12a, controlling the viscosity of the first part 12a into the viscosity making the element 13 naturally immovable.

18 Claims, 13 Drawing Sheets

U.S. PATENT DOCUMENTS

| | | |
|---|---|---|
| 2003/0162463 A1* | 8/2003 | Hayashi et al. ............ 445/24 |
| 2004/0012337 A1 | 1/2004 | Oohata et al. |
| 2004/0195576 A1 | 10/2004 | Watanabe et al. |
| 2005/0233504 A1 | 10/2005 | Doi et al. |

FOREIGN PATENT DOCUMENTS

| | | |
|---|---|---|
| JP | 1503424 | 11/1989 |
| JP | 2001-087953 | 4/2001 |
| JP | 200187953 | 4/2001 |
| JP | 2002314052 | 10/2002 |
| JP | 2004273596 | 9/2004 |
| JP | 2004-281630 | 10/2004 |
| JP | 2004-304161 | 10/2004 |
| JP | 2004281630 | 10/2004 |
| JP | 2004304161 | 10/2004 |
| JP | 2005-014141 | 1/2005 |
| JP | 200514141 | 1/2005 |
| JP | 2002311858 | 10/2008 |
| WO | 8809724 | 12/1988 |

* cited by examiner

[FIG. 1]
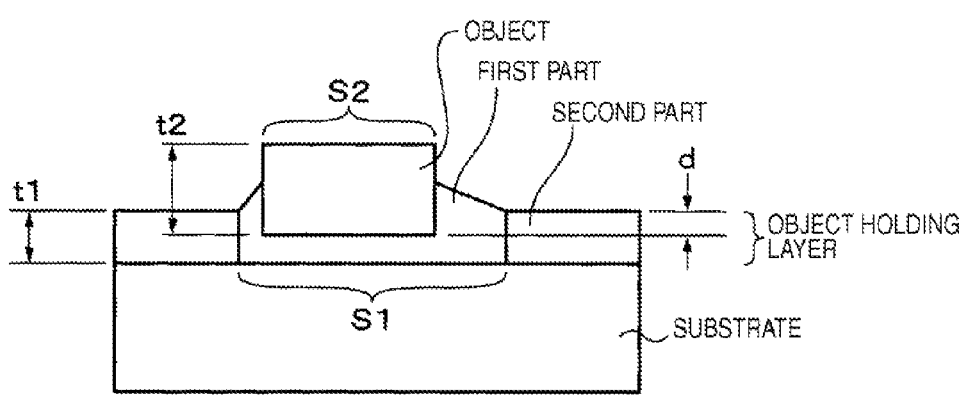

[FIG. 2]
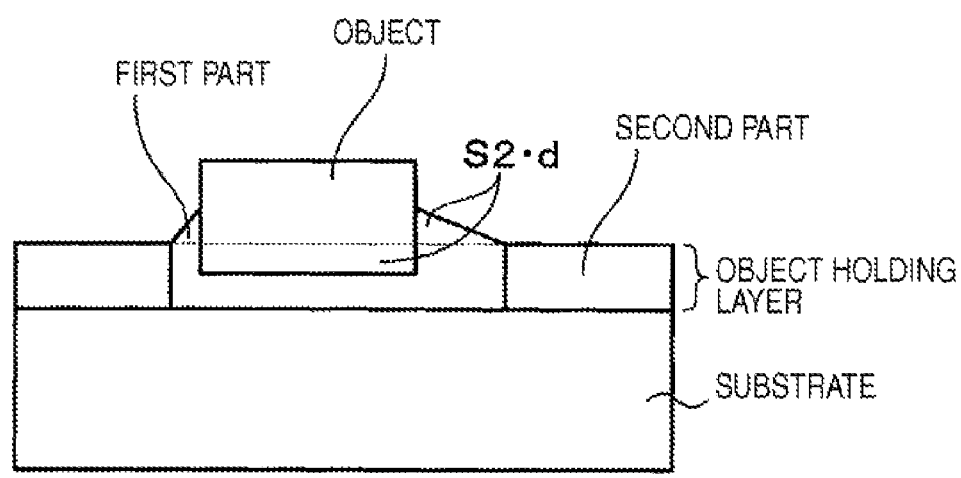

[FIG. 3]
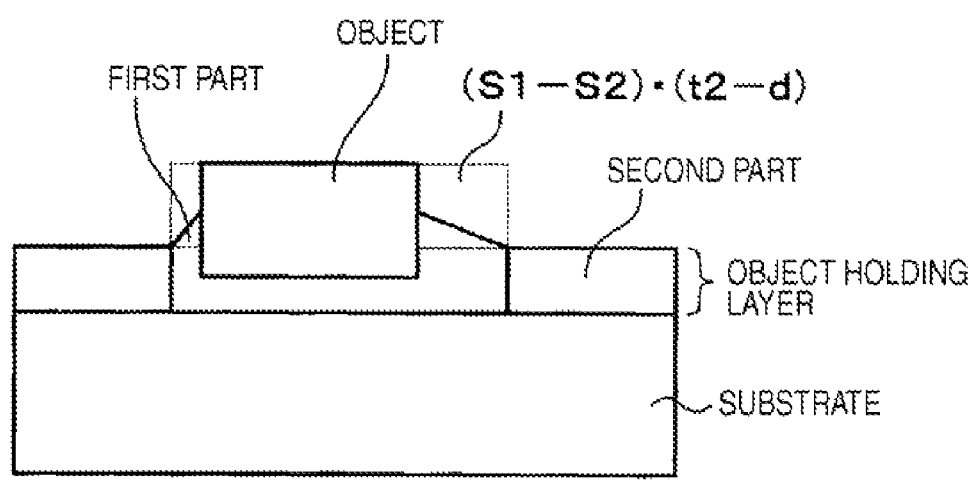

[FIG. 4]
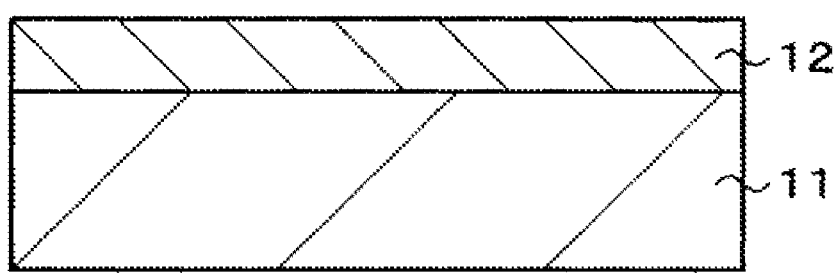

[FIG. 5]
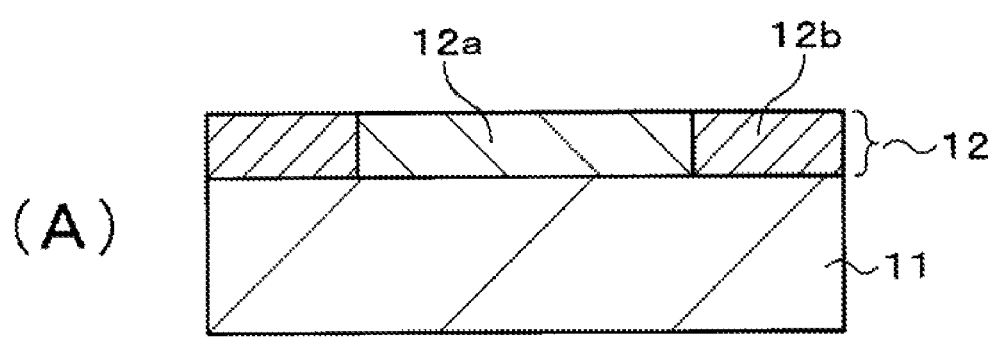
(A)
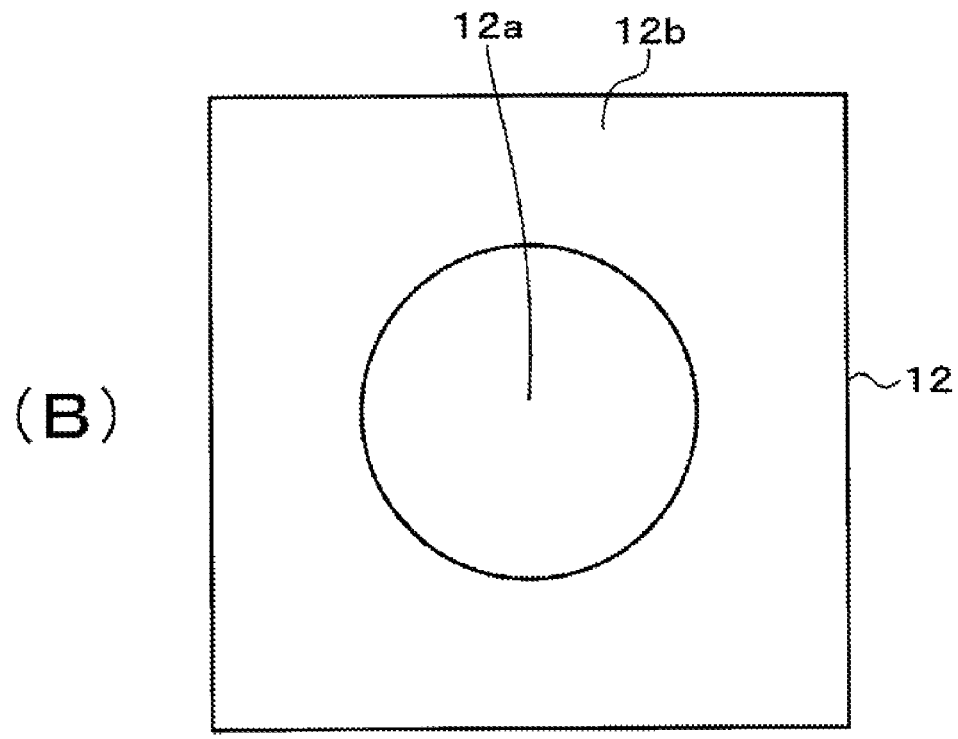
(B)

[FIG. 6]
(A)
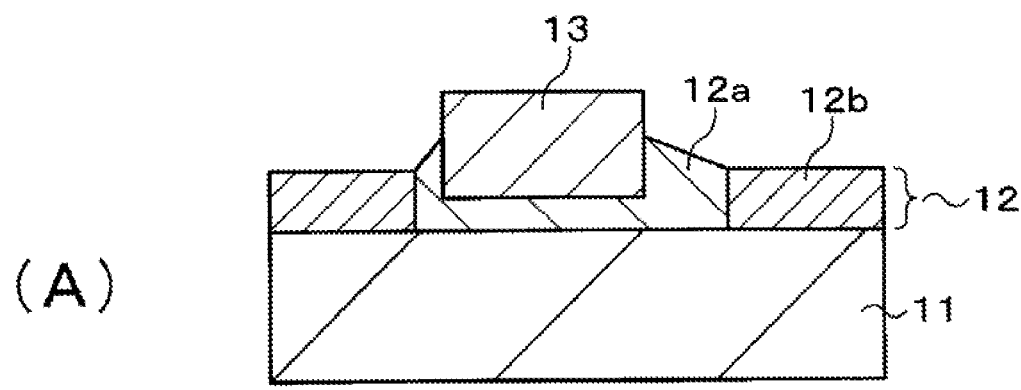
(B)
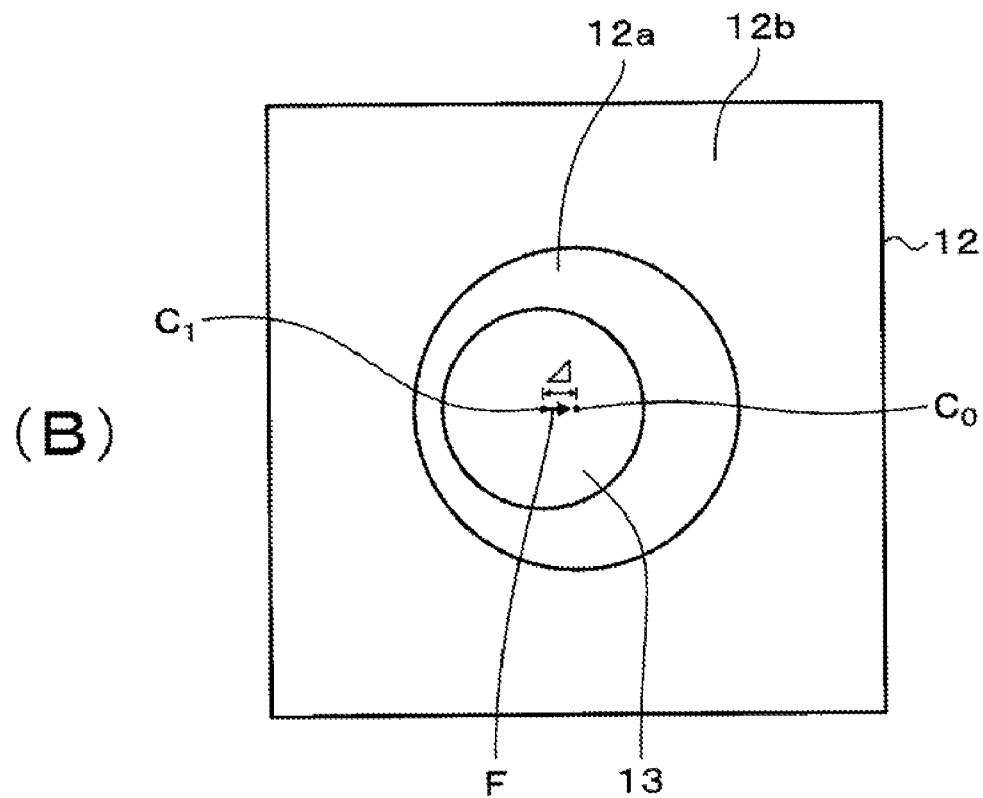

[FIG. 7]
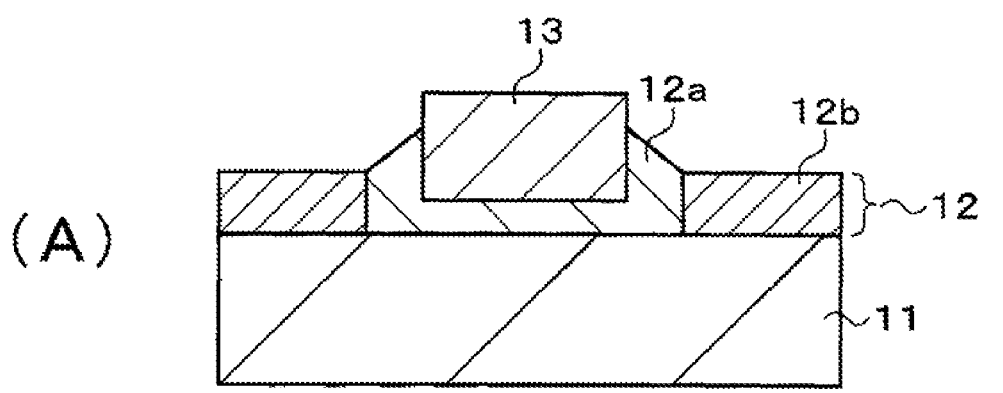
(A)
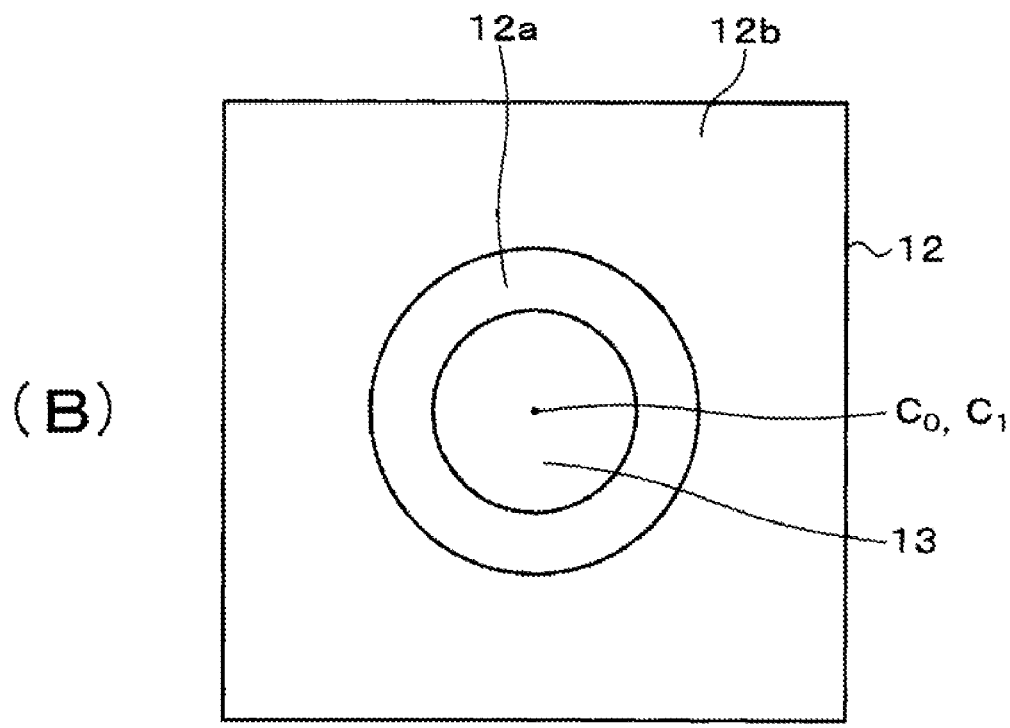
(B)

[FIG. 8]
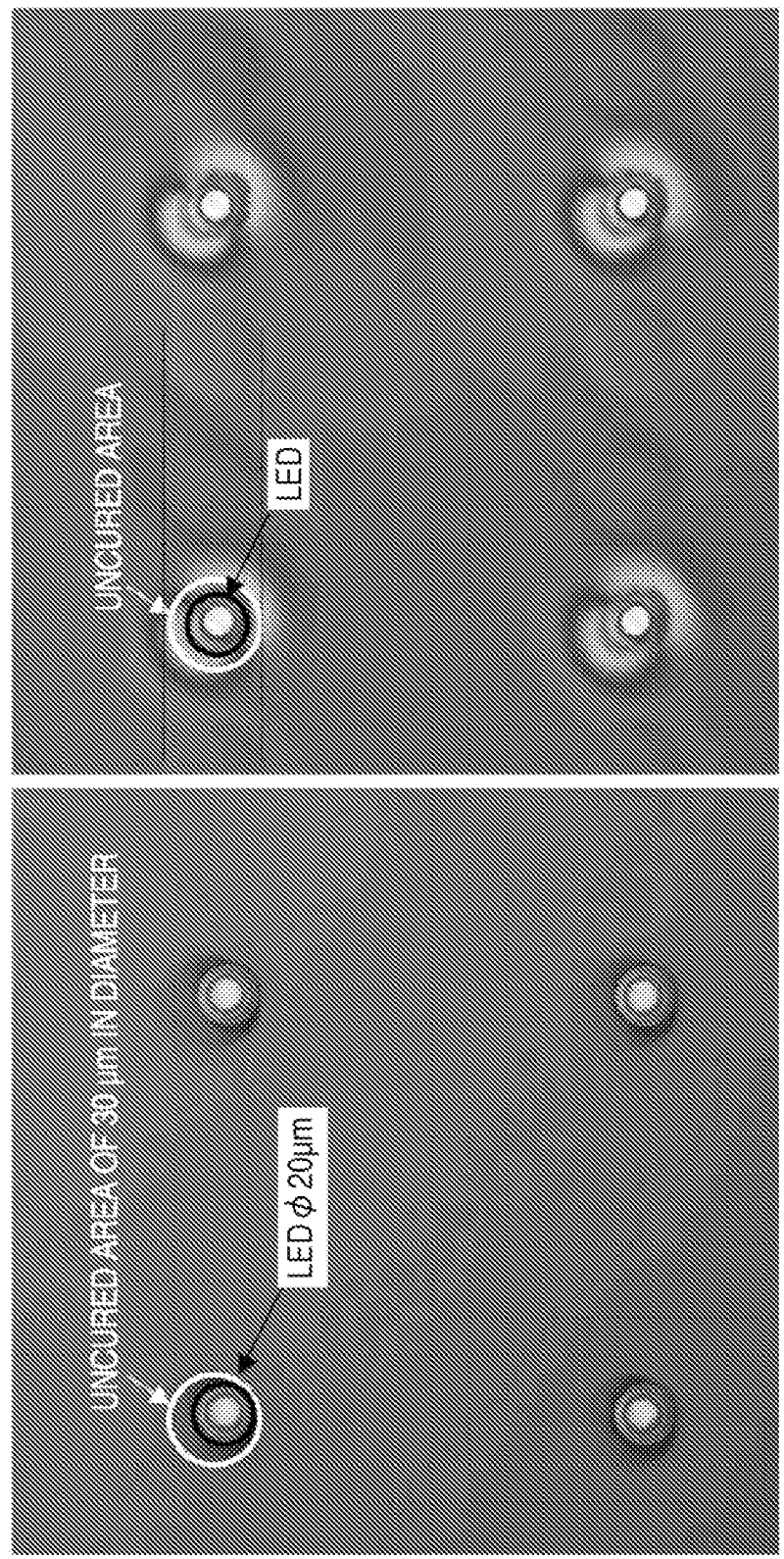

[FIG. 9]
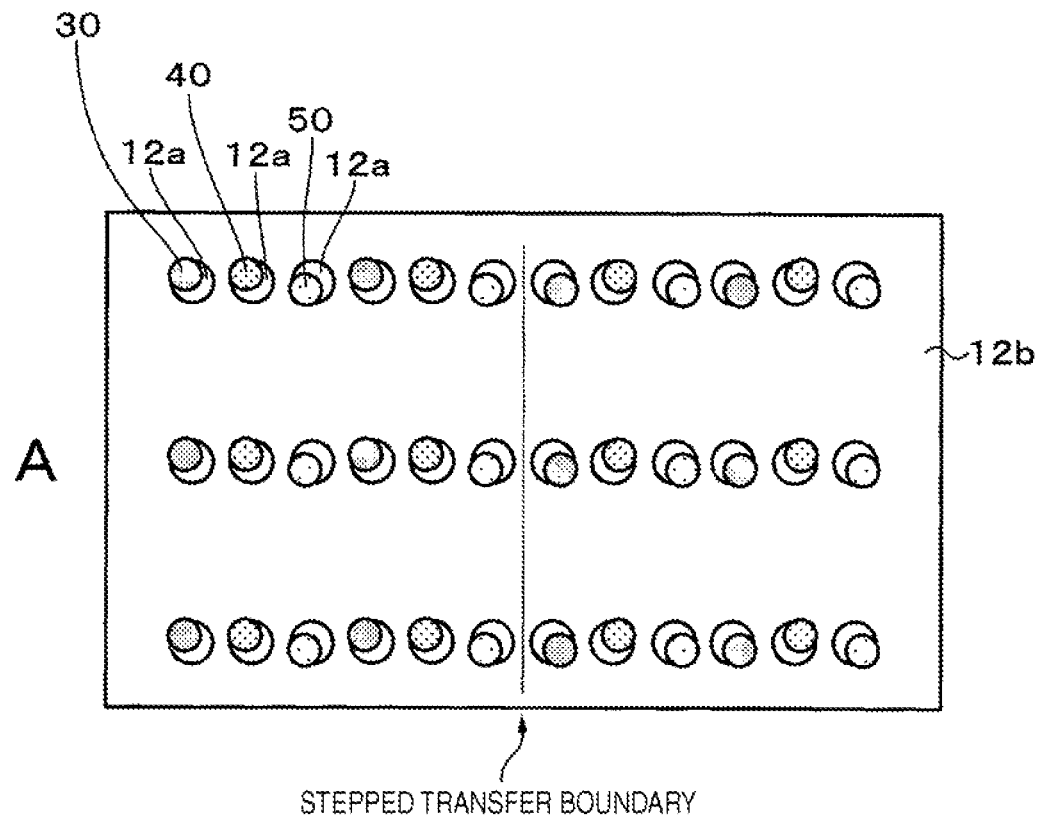
A
STEPPED TRANSFER BOUNDARY
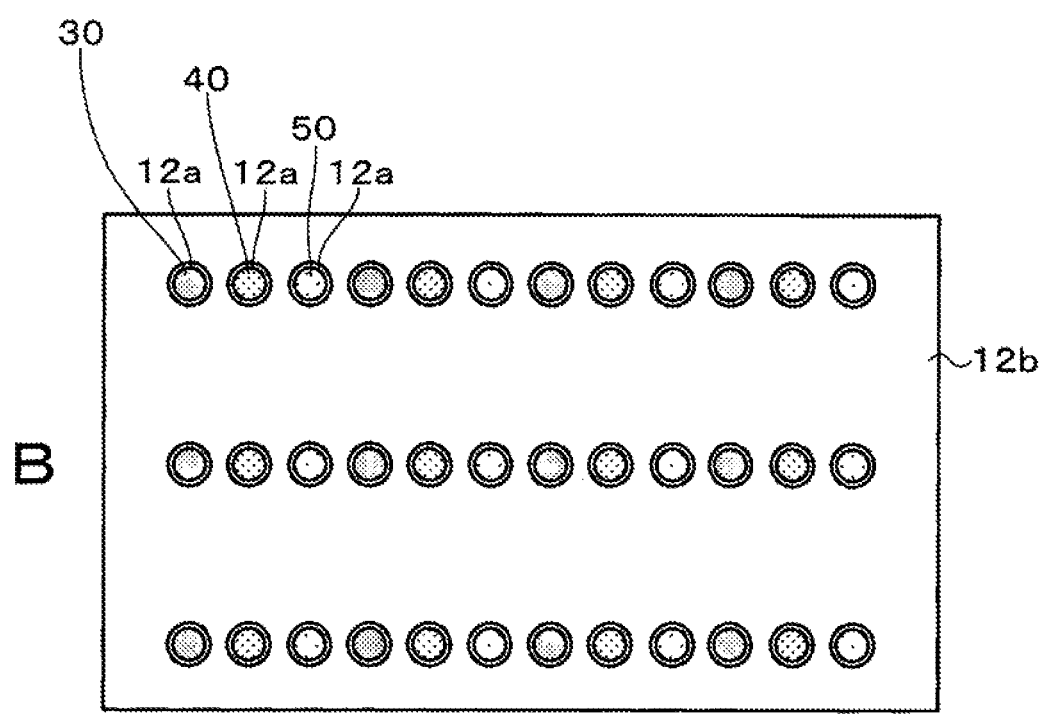
B

[FIG. 10]
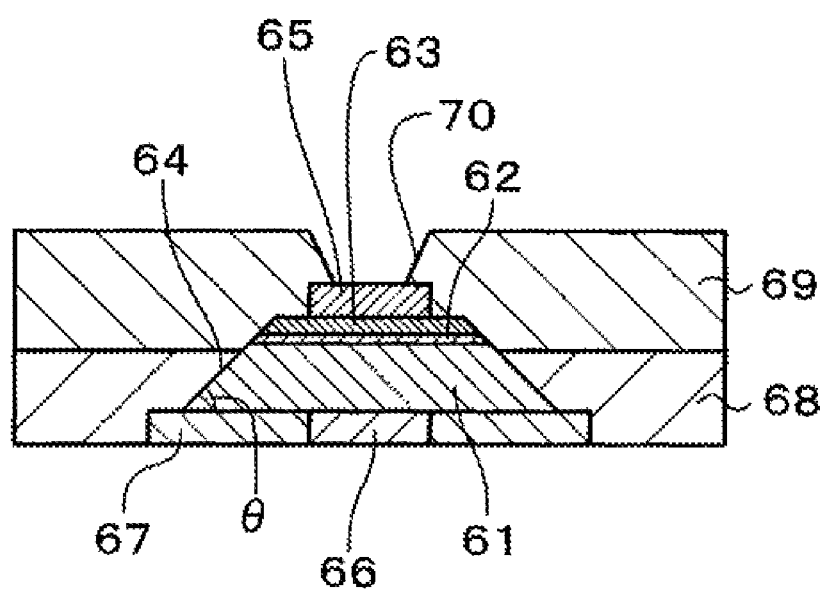

[FIG. 11]
(A)
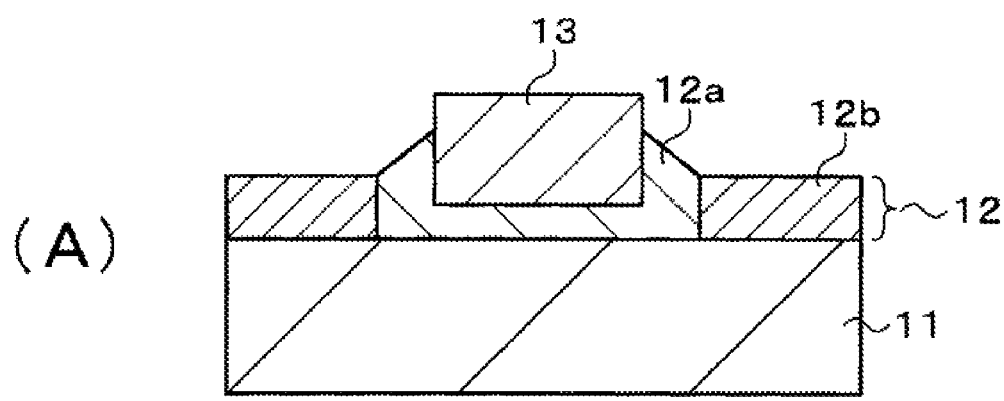
(B)
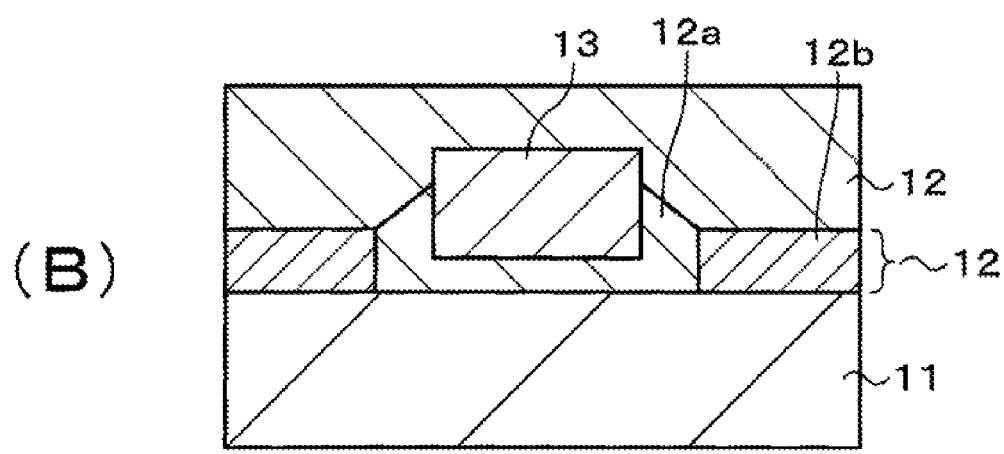

[FIG. 12]
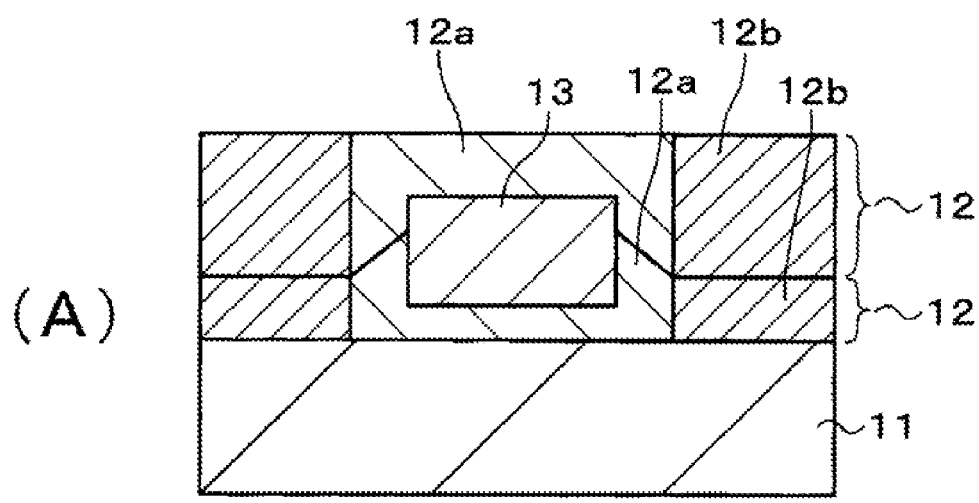
(A)
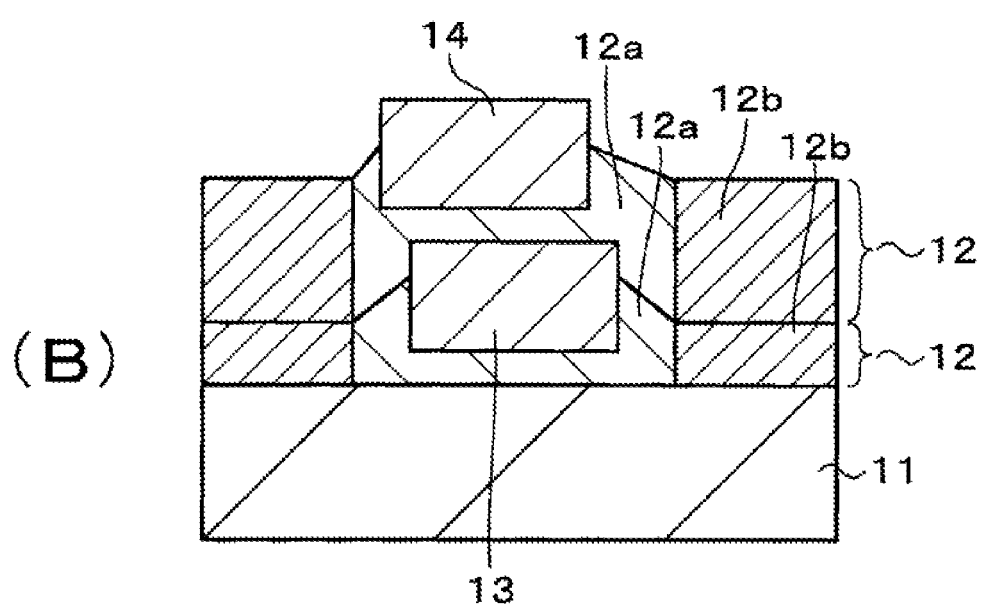
(B)

[FIG. 13]
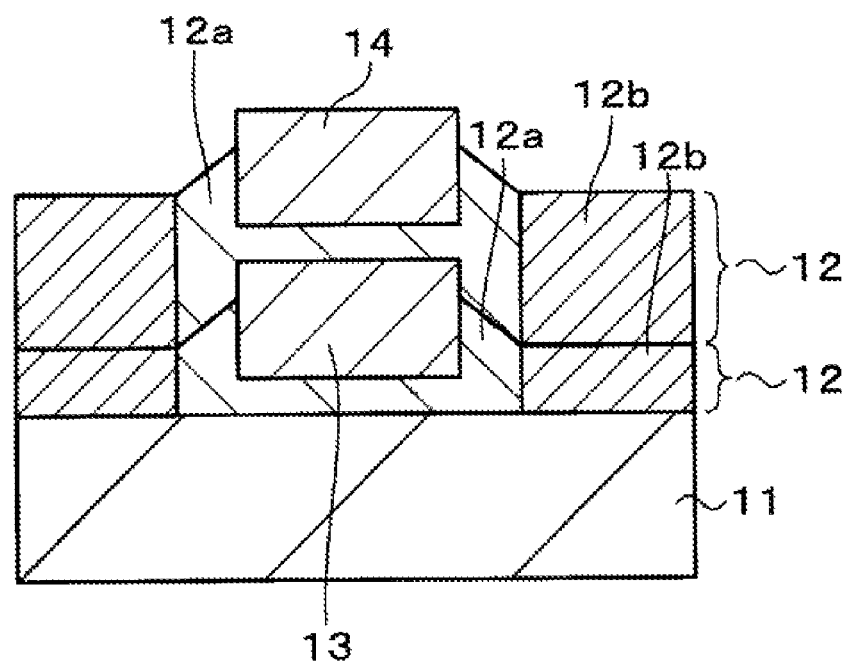

MOUNTING METHOD, MOUNTED STRUCTURE, MANUFACTURING METHOD FOR ELECTRONIC EQUIPMENT, ELECTRONIC EQUIPMENT, MANUFACTURING METHOD FOR LIGHT-EMITTING DIODE DISPLAY, AND LIGHT-EMITTING DIODE DISPLAY

CROSS REFERENCE TO RELATED APPLICATIONS

The present application claims priority to Japanese Patent Document No. P2006-191365 filed on Aug. 31, 2007, the disclosures of which are herein incorporated by reference.

The present invention relates to a mounting method, a mounted structure, a manufacturing method for electronic equipment, electronic equipment, a manufacturing method for a light-emitting diode display, and a light-emitting diode display.

The positional precision of each pixel in a display is generally requested to be about ¹/₁₀₀ of a pixel pitch from the viewpoint of homogeneity of a screen. Therefore, in a display to be manufactured by mounting spontaneous light-emitting elements such as light-emitting diodes on a substrate, the precision in a mounted position of about ¹/₁₀₀ of a pixel pitch is requested. For example, in a full-high definition (HD) full-color display having a diagonal of 40 inches, since the number of pixels in a horizontal direction of a screen is 1920 and the number of pixels in a vertical direction of the screen is 1080, the pixel pitch comes to 0.461 mm and the requested precision in a mounted position comes to ±0.005 mm (5 μm). In this case, the number of light-emitting elements to be mounted comes to 1920×1080×(the numbers of light-emitting elements of three colors of red (R), green (G), and blue (B) used to constitute one pixel), that is, approximately 2 million×(the numbers of light-emitting elements of three colors of R, G, and B used to constitute one pixel). In order to mount such an enormous number of light-emitting elements on a 40-inch substrate with the positional precision of ±0.005 mm, development of a very high-precision mounting apparatus is required. Moreover, when a large-screen display is produced by forming a light-emitting element array in a size smaller than the screen size, and sequentially mounting the light-emitting element array on the substrate while shifting the position, that is, performing stepped mounting, higher precision in a mounted position is requested for a difference in a pitch of a light-emitting element array formed first. For example, when the difference in a pitch is ±0.002 mm, the precision in a mounted position is requested to be ±0.003 mm. Considerable difficulty arises from the viewpoint of the cost of the mounting apparatus and a throughput.

A manufacturing method for a composite element in which a convex part is formed on a substrate, a liquid adhesive is dropped on the convex part so that it will moisten and spread in a hemispheric state due to a surface tension, a member is placed on the liquid adhesive so that a force causing a distribution of contact angles to become uniform will work on the member and the member will be aligned, and ultraviolet rays are irradiated to the member in order to secure the member has been proposed (refer to JP-A-2005-14141). However, the JP-A-2005-14141 neither discloses nor implies an invention characterized in that: an object holding layer made of a material whose viscosity can be controlled is formed; the viscosity of a first part of the object holding layer including a mounting region for an object is controlled into a viscosity making the object movable, and the viscosity of a second part of the object holding layer outside the first part is controlled into a viscosity making the object immovable; after the object is mounted in the first part, the viscosity of the first part is controlled into the viscosity making the object immovable.

SUMMARY

The difficulty in mounting arises not only when a light-emitting element is mounted but also when a microscopic object is generally mounted with the positional precision that is on the order of micrometers.

A problem the present invention attempts to resolve is to provide a mounting method in which when an object such as an element, or more particularly, a microscopic object is mounted on a substrate, the object can be mounted readily and reliably with high positional precision, and a mounted structure that has objects mounted therein according to the mounting method.

Another problem the present invention attempts to resolve is to provide a manufacturing method for electronic equipment based on the foregoing mounting method, and electronic equipment.

Still another problem the present invention attempts to resolve is to provide a manufacturing method for a light-emitting diode display based on the foregoing mounting method, and a light-emitting diode display.

In order to resolve the foregoing problem, a first invention is a mounting method characterized in that the mounting method includes:

a step of forming an object holding layer, which is made of a material whose viscosity can be controlled, on a substrate;

a step of controlling the viscosity of a first part of the object holding layer, which includes a mounting region for an object, into a viscosity making the object movable, and controlling the viscosity of a second part of the object holding layer outside the first part into a viscosity making the object immovable;

a step of mounting at least one object in the first part; and a step of, after mounting the object in the first part, controlling the viscosity of the first part into the viscosity making the object immovable.

A second invention is a mounted structure characterized in that the mounted structure is manufactured by implementing at least:

a step of forming an object holding layer, which is made of a material whose viscosity can be controlled, on a substrate;

a step of controlling the viscosity of a first part of the object holding layer, which includes a mounting region for an object, into a viscosity making the object movable, and controlling the viscosity of a second part of the object holding layer outside the first part into a viscosity making the object immovable;

a step of mounting at least one object in the first part; and a step of after mounting the object in the first part, controlling the viscosity of the first part into the viscosity making the object immovable.

In the first and second inventions, the state in which the first part exhibits the viscosity making the object movable corresponds to a state in which the first part has such fluidity that the object can naturally move, and the state in which the second part or first part exhibits the viscosity making the object immovable corresponds to a state in which the second part or first part hardly has fluidity (nearly hardens) and the object cannot naturally move.

The number of objects to be mounted in the first part is typically one. In some cases, a plurality of objects may be mounted. The objects may be of the same type or may be of different types. Thinking of a case where one object is embedded and mounted in the first part, since the first part has fluidity, the first part around the object swells. At this time, inside a substrate surface, if the center of gravity of the object is deviated from the center of gravity of the first part, a resultant force of components of a surface tension of the first part, which comes into contact with the flank of the object, in parallel with the substrate surface works on the object. The resultant force is oriented to the center of gravity of the first part. The resultant force acts as a driving force, and the object automatically (naturally) moves toward the center of gravity of the first part. Accordingly, the resultant force diminishes. Inside the substrate surface, when the center of gravity of the object squares with the center of gravity of the first part, the resultant force becomes null, and the movement of the object ceases. When the object is merely embedded and mounted in the first part, the center of gravity of the object can be automatically positioned at the center of the gravity of the first part. Namely, the object can be autonomously aligned with the first part (self-alignment). In order to achieve the autonomous alignment for a shorter time, it proves effective that after the object is mounted in the first part, before the viscosity of the first part is controlled into the viscosity making the object immovable, the viscosity of the first part is lowered. In order to more effectively achieve the autonomous alignment, when the object is mounted in the first part, the contact angle of the first part with respect to the flank (end surface) of the object should preferably be equal to or smaller than 90°. In particular, when the viscosity of the first part is lowered in order to achieve the autonomous alignment for a shorter period of time, the contact angle of the first part with respect to the flank (end surface) of the object in this state should preferably be equal to or smaller than 90°. In order to facilitate the autonomous alignment, an ultrasonic vibration or the like may be applied to the substrate. If multiple objects are embedded and mounted in the first part, the aforesaid resultant force works on each of the objects according to the position. The objects are automatically (naturally) arrayed around the center of gravity of the first part. In this case, the objects may come into contact with one another and enter an aggregated state.

The viscosity of the first part making the object movable ranges, for example, 1 to 10000 Pa·s. However, the present invention is not limited to the viscosity. If the viscosity of the first part is lowered in order to achieve autonomous alignment for a shorter period of time, the lowered viscosity ranges, for example, 0.001 to 10 Pa·s. However, the present invention is not limited to the viscosity. For reference, the viscosity of water at room temperature is 0.001 Pa·s.

Typically, the first part is formed to be surrounded by the second part. If one object is embedded and mounted in the first part, the planar shape of the first part and the planar shape of the object should preferably be analogous to each other from the viewpoint of precise positioning of the object at the center of gravity of the first part. The planar shape of the first part is preferably rotationally symmetrical, or more particularly, circular or equilaterally polygonal (equilaterally triangular, square, pentagonal, or hexagonal), or is a deformed circle or polygon. The planar shape of the first part is not necessarily rotationally symmetrical but may be linearly symmetrical or symmetrical with respect to a point. Otherwise, the planer shape of the first part may not have symmetry.

FIG. 1 shows a state in which: an object holding layer made of a material whose viscosity can be controlled is formed on a substrate; the viscosity of a first part of the object holding layer, which includes a mounting region for an object, is controlled into a viscosity making the object movable, and the viscosity of a second part of the object holding layer outside the first part is controlled into a viscosity making the object immovable; and at least one object is embedded and mounted in the first part. The thickness of the object holding layer to be formed first is t1, the area of the first part is S1, the area of the bottom of the object is S2, the height of the object is t2, and the difference between the height of the bottom of the object, which is mounted in the first part, and the height of the surface of the object holding layer is d. At this time, preferably, 1<S1/S2<100, more preferably, 1<S1/S2<10, or more preferably, 1<S1/S2<5 should be established from the viewpoint that a force large enough to move the object toward the center of gravity of the first part due to a surface tension of the first part should work. As shown in FIG. 2, the volume of part of the object embedded in the first part is S2·d, and the volume of part of the first part that has swelled around the object because the object has expelled the first part is also S2·d. In FIG. 3, the volume of a region indicated with a dot line is expressed as (S1−S2)·(t2−d). Preferably, (S1−S2)·(t2−d) >S2·d should be established from the viewpoint that a force large enough to move the object toward the center of gravity of the first part due to the surface tension of the first part should work. When the region is deformed, S1·d<(S1·S2)·t2 is established.

The object holding layer made of a material whose viscosity can be controlled may fundamentally be made of any material as long as the viscosity can be controlled according to any method, such as, irradiation of light (especially, ultraviolet rays), a radiation (X-rays or the like), or an electron beam, or application of heat, a pressure, an electric field, or a magnetic field. An object holding layer which can be readily formed and whose viscosity can be readily controlled is, for example, a resin layer, or more particularly, a layer made of a photosensitive resin, a thermosetting resin, or a thermoplastic resin. As the photosensitive resin, a known one can be adopted. Specifically, for example, a compound whose exposed part becomes poorly soluble due to a photo-crosslinking reaction, such as, polycinnamic acid vinyl or polyvinyl azidobenzal, a negative compound whose exposed part becomes poorly soluble due to a photo-polymerization reaction such as acrylamide, or a positive compound whose quinonediazide group such as o-quinonediazide novolac resin produces carboxlic acid through photo-decomposition and becomes readily soluble can be adopted. As the thermosetting resin, a known one can be adopted. Specifically, for example, an epoxy resin, a phenolic resin, a urea resin, a melamine resin, an unsaturated polyester resin, a polyurethane resin, or polyimide can be adopted. As the thermoplastic resin, a known one can be adopted. Specifically, for example, polyethylene, polystyrene, polyvinyl chloride, or polyamide can be adopted. For example, when a resin layer made of the photosensitive resin is employed, after the resin layer is formed while having fluidity, if light is selectively irradiated to the second part, the second part can be cured. Moreover, when a resin layer made of the thermosetting resin is employed, after the resin layer is formed while having fluidity, if the second part is selectively heated by irradiating light, the second part can be cured. When a resin layer made of the thermoplastic resin is employed, after the resin layer is formed while not having fluidity, if the first part is selectively heated by irradiating light, the first part is fused to have fluidity. Aside from the foregoing materials, the material whose viscosity can be controlled may be, for example, a pressure-sensitive resin layer (for example, an acrylic one), a metal (a metal of a simple substance or an alloy), or glass.

An object to be mounted in the first part may be fundamentally any one. Whatever shape, size, material, function, or usage the object has, and whichever of a living being or a non-living being the object is, the object is typically an element having any function or usage. The element is, for example, a light-emitting element (a light-emitting diode, semiconductor laser, electroluminescence (EL) element, or the like), a light-receiving element (a photodiode, CCD sensor, MOS sensor, or the like), or an electronic element (an IC chip or the like). The element encompasses, aside from a semiconductor element (a light-emitting element, light-receiving element, electron transit element, or the like), various elements such as a piezoelectric element, a pyroelectric element, an optical element (a second-order harmonic generation element employing a nonlinear optical crystal), a dielectric element (including a ferroelectric element), and a superconducting element. The object to be mounted in the first part may be a microscopic part or element to be employed in, for example, various micro-electromechanical systems (MEMS) such as an optical encoder. The size (chip size) of the object or element is not restricted to any specific one. The object or element is typically microscopic, or more particularly, has a size equal to or smaller than, for example, 1 mm, equal to or smaller than, for example, 300 µm, or equal to or smaller than, for example, 100 µm. However, the size is not limited to this value.

The number of objects to be mounted on a substrate is singular or plural. The number of objects, the kind thereof, the arrangement thereof, and the spacing thereof are determined based on the usage of the substrate or the function thereof.

When multiple objects are mounted on a substrate, first parts are formed in an object holding layer in an arrangement corresponding to the arrangement of the objects. In this case, the distance between the first parts is preferably 0.1 or more times larger than the thickness of the object holding layer. The arrangement of the objects, that is, the arrangement of the first parts may be regular or irregular. For example, multiple first parts may be grouped into one set, and the set may be cyclically repeated. In this case, different objects or elements may be mounted in the multiple first parts of each set, or identical objects or elements may be mounted therein. Specifically, for example, when a display or the like is manufactured by mounting multiple red illuminant light-emitting diodes, multiple green illuminant light-emitting diodes, and multiple blue illuminant light-emitting diodes on a substrate, for example, three first parts are grouped into one set, and the set is cyclically repeated. In this case, the red illuminant light-emitting diode, green illuminant light-emitting diode, and blue illuminant light-emitting diode are mounted in the three first parts of each set.

Moreover, after all objects to be mounted on a substrate are individually mounted in first parts, the objects may be comprehensively autonomously aligned. After all the objects to be mounted on the substrate are comprehensively mounted in the first parts, the objects may be comprehensively autonomously aligned. After all the objects to be mounted on the substrate are divided and repeatedly mounted at multiple times (stepped mounting or stepped transfer), the objects may be comprehensively autonomously aligned. After multiple kinds of objects to be mounted on the substrate are mounted in the first parts, the objects may be comprehensively autonomously aligned.

If necessary, after an object is mounted in a first part and the viscosity of the first part is controlled into a viscosity making the object immovable, a step at which the viscosity of a region, which contains at least the object, in the first part is controlled into a viscosity making the object movable may be implemented. In this case, for example, if the position of the object whose mounting is completed is found to be deviated from a scheduled mounted position for some reason, the position can be finely adjusted and the object can be highly precisely positioned at the scheduled mounted position. In this case, the region out of the first part of which viscosity is controlled into the viscosity making the object movable is selected so that a force causing the object to move to the scheduled mounted position will be generated.

Further, if necessary, after the step at which an object is mounted in a first part of an object holding layer made of a material whose viscosity can be controlled and the viscosity of the first part is controlled into a viscosity making the object immovable is implemented, a step at which: an object holding layer made of the material whose viscosity can be controlled is formed again on the above object holding layer; an object is mounted in the first part of the object holding layer; and the viscosity of the first part is controlled into the viscosity making the object immovable may be repeatedly implemented. Thus, the objects can be mounted three-dimensionally.

A mounted structure may fundamentally have any usage and function, and is, for example, a light-emitting diode display, a light-emitting diode backlight, a light-emitting diode lighting device, an EL display, or electronic equipment.

A third invention is a manufacturing method for electronic equipment characterized in that the manufacturing method includes:

a step of forming an element holding layer, which is made of a material whose viscosity can be controlled, on a substrate;

a step of controlling the viscosity of a first part of the element holding layer, which includes a mounting region for an element, into a viscosity making the element movable, and controlling the viscosity of a second part of the element holding layer outside the first part into a viscosity making the element immovable;

a step of mounting at least one element in the first part; and a step of, after mounting the element in the first part, controlling the viscosity of the first part into the viscosity making the element immovable.

A fourth invention is electronic equipment characterized in that the electronic equipment is manufactured by implementing at least:

a step of forming an element holding layer, which is made of a material whose viscosity can be controlled, on a substrate;

a step of controlling the viscosity of a first part of the element holding layer, which includes a mounting region for an element, into a viscosity making the element movable, and controlling the viscosity of a second part of the element holding layer outside the first part into a viscosity making the element immovable;

a step of mounting at least one element in the first part; and a step of after mounting the element in the first part, controlling the viscosity of the first part into the viscosity making the element immovable.

The electronic equipment may be fundamentally any one and may be either portable or stationary. Concrete examples are a portable cellular phone, mobile equipment, a robot, a personal computer, onboard equipment, and various home electric appliances.

In the third and fourth inventions, aside from what are described above, the object holding layer, the mounting region for an object, and the object can be replaced with the element holding layer, the mounting region for an element, and the element respectively, as long as the natures thereof are not contradicted. The description made in relation to the first and second inventions is established.

A fifth invention is a manufacturing method for a light-emitting diode display, which has multiple red illuminant light-emitting diodes, multiple green illuminant light-emitting diodes, and multiple blue illuminance light-emitting diodes mounted on a substrate, characterized in that the manufacturing method includes:

a step of forming an element holding layer, which is made of a material whose viscosity can be controlled, on the substrate;

a step of controlling the viscosity of a first part of the element holding layer, which includes a mounting region for a light-emitting diode, into a viscosity making the light-emitting diodes movable, and controlling the viscosity of a second part of the element holding layer outside the first part into a viscosity making the light-emitting diode immovable;

a step of mounting at least one light-emitting diode in the first part; and a step of after mounting the light-emitting diode in the first part, controlling the viscosity of the first part into the viscosity making the light-emitting diode immovable.

A sixth invention is a light-emitting diode display, which has multiple red illuminant light-emitting diodes, multiple green illuminant light-emitting diodes, and multiple blue illuminant light-emitting diodes mounted on a substrate, characterized in that the light-emitting diode display is manufactured by implementing at least:

a step of forming an element holding layer, which is made of a material whose viscosity can be controlled, on the substrate;

a step of controlling the viscosity of a first part of the element holding layer, which includes a mounting region for a light-emitting diode, into a viscosity making the light-emitting diode movable, and controlling the viscosity of a second part of the element holding layer outside the first part into a viscosity making the light-emitting diode immovable;

a step of mounting at least one light-emitting diode in the first part; and a step of after mounting the light-emitting diode in the first part, controlling the viscosity of the first part into the viscosity making the light-emitting diode immovable.

In the fifth and sixth inventions, as the red illuminant light-emitting diode, green illuminant light-emitting diode, and blue illuminant light-emitting diode, diodes employing, for example, a group-III-V nitride compound semiconductor may be adopted. As the red illuminant light-emitting diode, a diode employing, for example, an AlGaInP semiconductor may be adopted.

In the fifth and sixth inventions, aside from what are described above, the object holding layer, the mounting region for an object, and the object can be replaced with the element holding layer, the mounting region for a light-emitting diode, and the light-emitting diode respectively, as long as the natures thereof are not contradicted. The description relating to the first and second inventions are established.

In the present invention having the foregoing constitution, when an object is mounted in the first part, if the center of gravity of the object is deviated from the center of gravity of the first part inside a substrate surface, a resultant force of components of a surface tension of the first part parallel to the substrate surface works on the object. The force acts as a driving force, and the object moves toward the center of gravity of the first part. The force gradually diminishes as the center of gravity of the object approaches the center of gravity of the first part, and becomes null when the center of gravity of the object squares with the center of gravity of the first part. Thus, once an object is mounted in the first part, the object can be automatically positioned at the center of gravity of the first part highly precisely. Namely, the object can be autonomously aligned with the first part.

Additional features and advantages of the present invention are described in, and will be apparent from, the following Detailed Description and the Figures.

BRIEF DESCRIPTION OF THE FIGURES

FIG. 1 is a sectional view for explaining a mounting method in accordance with the present invention.

FIG. 2 is a sectional view for explaining the mounting method in accordance with the present invention.

FIG. 3 is a sectional view for explaining the mounting method in accordance with the present invention.

FIG. 4 is a sectional view for explaining a mounting method in accordance with a first embodiment of the present invention.

FIG. 5 includes a sectional view and a plan view for explaining the mounting method in accordance with the first embodiment of the present invention.

FIG. 6 includes a sectional view and a plan view for explaining the mounting method in accordance with the first embodiment of the present invention.

FIG. 7 includes a sectional view and a plan view for explaining the mounting method in accordance with the first embodiment of the present invention.

FIG. 8 includes drawing substitute photographs showing a state in which micro light-emitting diodes are mounted in a photosensitive resin layer according to the mounting method of the first embodiment of the present invention, and a state in which the micro light-emitting diodes are autonomously aligned.

FIG. 9 includes plan views showing a state in which micro light-emitting diodes are mounted in a photosensitive resin layer through stepped transfer in a second embodiment of the present invention, and a state in which the micro light-emitting diodes are autonomously aligned.

FIG. 10 is a sectional view showing a micro light-emitting diode in accordance with a third embodiment of the present invention.

FIG. 11 includes sectional views for explaining a mounting method for an element in accordance with a fourth embodiment of the present invention.

FIG. 12 includes sectional views for explaining the mounting method for an element in accordance with the fourth embodiment of the present invention.

FIG. 13 is a sectional view for explaining the mounting method for an element in accordance with the fourth embodiment of the present invention.

DETAILED DESCRIPTION

Referring to the drawings, embodiments of the present invention will be described below. In all the drawings of the embodiments, the same reference numerals are assigned to identical or equivalent parts.

To begin with, a mounting method for elements in accordance with the first embodiment of the present invention will be described below.

FIG. 4 to FIG. 7 show the mounting method for elements in accordance with the first embodiment.

In the first embodiment, as shown in FIG. 4, an element holding layer 12 made of a material whose viscosity can be controlled is first formed on a substrate 11. The element holding layer 12 may be formed according to any method. Specifically, for example, the element holding layer can be formed through, for example, coating (spin coat or the like) or printing (a contact print method, an imprint method, screen printing, gravure, offset printing, or the like). The element holding layer 12 is made of, for example, a photosensitive resin or a thermosetting resin. However, the present embodiment is not limited to the resin. Immediately after the element holding layer 12 is formed, the element holding layer 12 is in an uncured state but has a viscosity that is low enough for an element to move when the element is embedded and mounted in the element holding layer 12, and has fluidity.

Thereafter, as shown in FIG. 5(A), the viscosity of a first part 12a of the element holding layer 12, which includes a mounting region for an element, is controlled into a viscosity making the element to be mounted naturally movable, and the viscosity of a second part 12b of the element holding layer 12 outside the first part 12a is selectively cured and thus controlled into a viscosity making the element naturally immovable. When the element holding layer 12 is made of, for example, the photosensitive resin, the cure can be achieved by selectively irradiating light such as ultraviolet rays or an electron beam to the second part 12b under a condition for exposure dependent on the photosensitive resin employed, and thus exposing the second part 12b. When the element holding layer 12 is made of the thermosetting resin, the cure can be achieved by selectively irradiating light such as ultraviolet rays or an electron beam to the second part 12b under a condition for exposure dependent on the thermosetting resin employed, and thus heating the second part 12b to the temperature equal to or higher than the cure temperature. FIG. 5(B) is a plan view showing this state. As shown in FIG. 5(B), the planar shape of the first part 12a is circular. In FIG. 5, only one first part 12a is shown. When multiple elements are mounted, multiple first parts 12a are formed.

Thereafter, as shown in FIG. 6(A), an element 13 having a cylindrical shape is embedded and mounted in the first part 12a of the element holding layer 12. FIG. 6(B) is a plan view showing this state. The element 13 should merely be mounted within the range of the first part 12a. Even if the mounting precision is low at this time, there is no problem. Herein, assume that the center of gravity $C_1$ of the element 13 is deviated from the center of gravity $C_0$ of the first part 12a by $\Delta$. When the element 13 is mounted in the first part 12a, components of a surface tension of the first part 12a parallel to a substrate surface exhibit an asymmetrical distribution with respect to the center of gravity $C_1$ of the element 13 while reflecting the fact that the center of gravity $C_1$ of the element 13 is deviated from the center of gravity $C_0$ of the first part 12a. As a result, the resultant force F of the components of the surface tension parallel to the substrate surface works on the element 13, and the element 13 inches toward the center of gravity $C_0$ of the first part 12a. The resultant force F gradually diminishes as the center of gravity $C_1$ of the element 13 approaches the center of gravity $C_0$ of the first part 12a. At the time point when the center of gravity $C_1$ of the element 13 squares with the center of gravity $C_0$ of the first part 12a, the resultant force F becomes null, and the movement of the element 13 ceases. After a certain time elapses, the center of gravity $C_1$ of the element 13 squares, as shown in FIG. 7, with the center of gravity $C_0$ of the first part 12a. Namely, the element 13 is autonomously aligned with the center of gravity $C_0$ of the first part 12a. The time required until the center of gravity $C_1$ of the element 13 squares with the center of gravity $C_0$ of the first part 12a is determined with the viscosity of the first part 12a, the magnitude of the resultant force of the components of the surface tension of the first part 12a parallel to the substrate surface, the magnitude $\Delta$ of the deviation of the center of gravity $C_1$ of the element 13 from the center of gravity $C_0$ of the first part 12a at the time of mounting, the mass of the element 13, and the temperature of the first part 12a. In order to shorten the time, preferably, while the state in which the second part 11b is cured is preserved by heating the substrate 11 at an appropriate temperature, the viscosity of the first part 12a is lowered so that the element 13 will be more movable.

In the state in which the element 13 is, as mentioned above, positioned at the center of gravity $C_0$ of the first part 12a, the first part 12a is cured. For example, when the element holding layer 12 is made of a photosensitive resin, the cure can be achieved by irradiating light to the first part 12a so as to expose the first part 12a. When the element holding layer 12 is made of a thermosetting resin, the cure can be achieved by irradiating light to the first part 12a so as to heat the first part 12a at the temperature equal to or higher than the cure temperature. As a result, the element 13 is firmly locked at the center of gravity $C_0$ of the cured first part 12a, and mounting is completed.

As mentioned above, according to the first embodiment, the element 13 can be autonomously aligned with the center of gravity $C_0$ of the first part 12a automatically and readily with high positional precision. For example, even if the positional precision the completed element 13 is requested to exhibit is ±1.5 μm, the initial precision in the mounted position of the element 13 may be as low as ±7 μm. Therefore, when numerous elements 13 are formed on the same substrate, the precision in formed positions or the precision in mounted positions offered by a mounting apparatus may be low. A reduction in the cost of manufacture of the element 13 and a reduction in the cost of the mounting apparatus can be achieved due to a reduction in a process cost. Moreover, when multiple elements 13 are mounted on the substrate 11, if the elements 13 are embedded and mounted in the element holding layer 12 which is in an uncured state, or for example, in an uncured resin, since the elements 13 have the nature of mutually aggregating, there is a fear that the positional precision of the elements 13 may be worse than the precision in the mounted positions by the mounting apparatus. In the first embodiment, since one element 13 is embedded and mounted in the first part 12a, which is in the uncured state, of the element holding layer 12, the aggregation of elements 13 can be essentially prevented.

Example

A glass substrate was adopted as the substrate 11, and micro light-emitting diodes of 20 μm in diameter and 12 μm in height having a cylindrical shape were mounted as the elements 13 on the glass substrate as mentioned below.

To begin with, alignment marks are formed in advance at predetermined positions on the glass substrate using a thin-film metal or the like.

Thereafter, a photosensitive resin layer of 3.5 μm in thickness was coated and formed on the glass substrate as the element holding layer 12 by performing spin coat.

Thereafter, an exposure apparatus, for example, a contact aligner or a stepper (reduced projection exposure apparatus) is used to irradiate ultraviolet rays to a region of the photosensitive resin layer on the glass substrate other than a region of 30 μm in diameter (first part 12a) at a pitch of 150 μm×150 μm with each of the alignment marks as a reference. The photosensitive resin layer is thus exposed. At this time, the positional precision relative to the alignment mark is ±1 μm. Thus, the second part 12b outside the circular first part 12a of 30 μm in diameter was cured (tentatively cured).

On the other hand, micro light-emitting diodes were formed as mentioned below. First, after an n-type GaN layer, an active layer, and a p-type GaN layer which constitute a light-emitting diode structure are sequentially grown on a sapphire substrate by using a known technique, the layers are patterned in the shape of a truncated cone, and p-side electrodes, an end surface protection layer and the like are formed in order to form a micro light-emitting diode array. Thereafter, according to a known laser selective transfer method including a step of fixing the p-side electrode side of the sapphire substrate to another substrate with a tentative adhesive layer between them and a step of selectively irradiating a laser beam, which is emitted from, for example, an excimer laser, from the back side of the sapphire substrate, the micro light-emitting diode array was mounted at the pitch of 150 μm×150 μm on a relay substrate having a slightly sticky silicon rubber formed thereon (refer to, for example, JP-A-2002-311858, JP-A-2002-314052, JP-A-2004-273596, and JP-A-2004-281630). The micro light-emitting diodes have a cylindrical shape of 20 μm in diameter and 12 μm in height. The precision in the relative position of the mounted micro light-emitting diodes is ±2 μm.

Thereafter, with each of the alignment marks formed on the glass substrate as a reference, each of the micro light-emitting diodes was embedded and mounted from the relay substrate in the circular first part 12a of 30 μm in diameter of the photosensitive resin layer on the glass substrate. At this time, the precision in the mounted position relative to the alignment mark is ±7 μm. In this state, the viscosity of the first part 12a is so low as to range from about 1 Pa·s to about 10000 Pa·s, and the first part 12a has sufficient fluidity. FIG. 8(A) shows an optical microscopic photograph of the state. In FIG. 8(A), a circular part noted as "uncured area of φ 30 μm" represents the first part 12a, and a circle noted as "LED φ 20 μm" represents a micro light-emitting diode. As seen from FIG. 8(A), the center of gravity of the micro light-emitting diode is considerably deviated from the center of gravity of the first part 12a.

Thereafter, the glass substrate having the micro light-emitting diodes mounted in the first parts 12a was heated to 80° C. Owing to the heating, while the state in which the second parts 12b were cured was preserved, the viscosity of the first parts 12a greatly decreased to range from 0.001 Pa·s to 10 Pa·s and the fluidity thereof greatly increased. At that time, the micro light-emitting diode mounted in each of the first parts 12a moved toward the center of gravity of the first part 12a. After three minutes elapsed since the heating to 80° C. was initiated, the center of gravity of the micro light-emitting diode almost squared with the center of gravity of the first part 12a. Thus, autonomous alignment was achieved to improve the positional precision of ±7 μm into ±1.5 μm. FIG. 8(B) shows an optical microscopic photograph of the state.

Thereafter, the photosensitive resin layer was entirely exposed using ultraviolet rays, and both the first parts 12a and second parts 12b were fully cured. Thus, the micro light-emitting diodes were firmly locked in the first parts 12a.

Next, the second embodiment of the present invention will be described below.

In the second embodiment, a description will be made of a method that uses the mounting method of the first embodiment to manufacture a micro light-emitting diode display by mounting red illuminant micro light-emitting diodes, green illuminant micro light-emitting diodes, and green illuminant micro light-emitting diodes on a substrate 11.

To begin with, alignment marks are formed in advance at predetermined positions on the transparent substrate 11 such as a glass substrate using a thin-film metal or the like.

Thereafter, a photosensitive resin layer is formed on the substrate 11 as an element holding layer 12, which is made of a material whose viscosity can be controlled, by performing spin coat or the like. The thickness of the photosensitive resin layer is, for example, 3.5 μm.

Thereafter, an exposure apparatus, for example, a contact aligner or a stepper is used to irradiate ultraviolet rays to a region other than a region (first part 12a) of 35 μm in diameter at a pitch of 150 μm×150 μm with each of the alignment marks as a reference so as to expose the photosensitive resin layer. At this time, the positional precision relative to the alignment mark is ±1 μm.

Thereafter, laser selective transfer or the like is performed in order to mount a micro light-emitting diode of 20 μm in diameter and 12 μm in height, which has a cylindrical shape, on a relay substrate, which has a slightly sticky silicon rubber formed thereon, at the pitch of 150 μm×150 μm. At this time, the precision in the relative position of the micro light-emitting diode is ±2 μm. Thus, micro light-emitting diodes of each of colors numbering 160×120=19200 are mounted on one relay substrate. Sixteen relay substrates on which micro light-emitting diodes of each of red, green, and blue are mounted are made ready for each of the colors.

Thereafter, with each of the alignment marks on the substrate 11 as a reference, the micro light-emitting diodes were embedded and mounted (transferred) from the relay substrates in the circular first parts 12a of 35 μm in diameter of the photosensitive resin layer on the glass substrate. At that time, the precision in the mounted position relative to the alignment mark is ±7 μm. In that state, the viscosity of the first parts 12a was so low as to range from about 1 Pa·s to about 10000 Pa·s and the first part 12a had sufficient fluidity. The transfer is repeatedly performed (stepped transfer) using the 4×4 relay substrates by shifting a position on the photosensitive resin layer, and further repeatedly performed for the micro light-emitting diodes of three colors of red, green, and blue. FIG. 9(A) shows part of the substrate 11 in this state. In FIG. 9(A), reference numeral 30 denotes a red illuminant micro light-emitting diode, reference numeral 40 denotes a green illuminant micro light-emitting diode, and reference numeral 50 denotes a blue illuminant micro light-emitting diode.

Thereafter, the glass substrate having the micro light-emitting diodes mounted in the first parts 12 as mentioned above is heated to 80° C. Owing to the heating, while the state in which the second parts 12b are cured is preserved, the viscosity of the first parts 12a greatly decreases to range from 0.001 to 10 Pa·s and the fluidity thereof greatly increases. At this time, each of the micro light-emitting diodes mounted in the first parts 12a moves toward the center of gravity of the first part 12a. After three minutes elapses since the heating to 80° C., the center of gravity of the micro light-emitting diode almost squares with the center of gravity of the first part 12a. Thus, autonomous alignment is achieved to improve the positional precision of ±7 μm into ±1.5 μm. Moreover, at this time, a stepped transfer boundary vanishes. FIG. 9(B) shows this state.

Thereafter, the photosensitive resin layer is entirely exposed using ultraviolet rays in order to fully cure the first parts 12a and second parts 12b. Thus, the micro light-emitting diodes are firmly locked in the first parts 12a.

Thereafter, each of the micro light-emitting diodes is wired and thus connected to a driving IC.

As mentioned above, a passive type micro light-emitting diode display having a pixel pitch of 150 μm, the positional precision of a micro light-emitting diode of ±1.5 μm, the number of pixels of 640×RGB×480, and a diagonal of 4.7 inches can be manufactured.

According to the second embodiment, similarly to the first embodiment, the red illuminant micro light-emitting diodes 30, green illuminant micro light-emitting diodes 40, and blue illuminant micro light-emitting diodes 50 can be readily arrayed on the substrate 11 with high positional precision. Therefore, the homogeneity of a display screen can be improved. Moreover, when a micro light-emitting diode display of a size larger than the size of a grown substrate such as a sapphire substrate on which the micro light-emitting diodes 30, 40, and 50 are formed is manufactured through stepped transfer, the stepped transfer boundary can be vanished. This contributes to improvement in the homogeneity of a display screen. For example, even when the positional precision the micro light-emitting diodes 30, 40, and 50 are requested at the time of completion of the display is ±1.5 μm, the initial precision in the mounted positions of the micro light-emitting diodes 30, 40, and 50 may be as low as ±7 μm. Therefore, when the numerous micro light-emitting diodes 30, 40, and 50 are formed on the same substrate, the precision in the formed positions or the precision in the mounted positions offered by a mounting apparatus may be low. Consequently, a reduction in the cost of manufacture for the micro light-emitting diodes 30, 40, and 50 or in the cost of the mounting apparatus can be achieved owing to a reduction in a process cost. Eventually, a reduction in the cost of manufacture for the micro light-emitting diode display can be achieved.

Next, the third embodiment of the present invention will be described below. In the third embodiment, a description will be made of a micro light-emitting diode preferably employed in a micro light-emitting diode display in accordance with the second embodiment.

FIG. 10 shows the micro light-emitting diode.

As shown in FIG. 10, in the micro light-emitting diode, a light-emitting diode structure is formed with an n-type semiconductor layer 61, an active layer 62 on the n-type semiconductor layer, and a p-type semiconductor layer 63 on the active layer. The n-type semiconductor layer 61, active layer 62, and p-type semiconductor layer 63 have, for example, a circular planar shape as a whole. The end surface (flank) 64 slopes at an angle $\theta$ with respect to the bottom of the n-type semiconductor layer 61. The sectional shape in the direction of the diameters of the n-type semiconductor layer 61, active layer 62, and p-type semiconductor layer 63 is trapezoidal ($\theta<90°$), rectangular ($\theta=90°$), or inversely trapezoidal ($\theta>90°$). For example, a circular p-side electrode 65 is formed on the p-type semiconductor layer 63. For example, a circular n-side electrode 66 is formed on part of the bottom of the n-type semiconductor layer 61. A transparent insulating layer 67 is formed around the n-side electrode 66 on the bottom of the n-type semiconductor layer 61. An insulating layer 68 is formed from the n-side electrode 66 and transparent insulating layer 67 up to the middle of the height of the end surface 64 so that it will cover the end surface 64. An insulating layer 69 is formed on the insulating layer 68 up to a position higher than the p-side electrode 65. A contact via 70 is formed in part of the insulating layer 69 on the p-side electrode 65. The contact via 70 is used to bring wiring into contact with the p-side electrode 65.

A semiconductor to be adopted for the n-type semiconductor layer 61, active layer 62, and p-type semiconductor layer 63 is selected in line with necessity. Specifically, for example, a GaN-series semiconductor or an AlGaInP-series semiconductor will do.

When the micro light-emitting diode is, for example, a GaN-series light-emitting diode, concrete examples of the dimensions and material will be described below. The n-type semiconductor layer 61 is an n-type GaN layer, and the thickness thereof is, for example, 2600 nm. The thickness of the active layer 62 is, for example, 200 nm. The p-type semiconductor layer 63 is a p-type GaN layer, and the thickness thereof is, for example, 200 nm. The active layer 62 has, for example, a multi-quantum well (MQW) structure composed of an InGaN well layer and a GaN barrier layer. When the GaN-series light-emitting diode is blue-illuminant, the In composition of the InGaN well layer is, for example, 0.17. When the GaN-series light-emitting diode is green-illuminant, the In composition is, for example, 0.25. Assuming that the maximum diameter of the light-emitting diode structure, that is, the diameter of the bottom of the n-type GaN layer 61 is a, a denotes, for example, 20 μm. When the thickness of the n-type GaN layer 61 serving as the n-type semiconductor layer 61 is 2600 nm and the thickness of the p-type GaN layers serving as the active layer 62 and p-type semiconductor layer 63 respectively is 200 nm, the overall thickness of the light-emitting diode structure comes to 2600+200+200=3000 nm=3 μm. In this case, assuming that the overall thickness (height) of the light-emitting diode structure is b, the aspect ratio of the light-emitting diode structure is expressed as b/a=3/20=0.15. $\theta$ is, for example, 50°. The p-side electrode 65 is formed with, for example, a metallic multilayer film having an Ag/Pt/Au structure. The thickness of the Ag film is, for example, 50 nm, the thickness of the Pt film is, for example, 50 nm, and the thickness of the Au film is, for example, 2000 nm. The p-side electrode 65 may be formed with a monolayer film made of Ag. The n-side electrode 66 is formed with a metallic laminated film having, for example, a Ti/Pt/Au structure. The thickness of each of the Ti film and Pt film is 50 nm, and the thickness of the Au film is, for example, 2000 nm.

In the micro light-emitting diode, light emanating from the active layer 62 during operation is reflected from the end surface 64, and extracted from the bottom of the n-type semiconductor layer 61 to outside, or routed directly to the bottom of the n-type semiconductor layer 61 and extracted to outside as it is.

According to the third embodiment, various advantages described below can be provided. Specifically, as described in relation to the second embodiment, since micro light-emitting diodes can be arrayed with high positional precision, various countermeasure steps to be performed on the micro light-emitting diodes against a positional deviation can be excluded.

Specifically, conventionally, the mounting method in accordance with the second embodiment is not employed but the precision offered by a mounting apparatus is improved in order to realize the positional precision of ±5 μm. In the second embodiment, since the positional precision of ±1.5 μm can be realized, the constitution of a micro light-emitting diode and the manufacturing method thereof can be greatly simplified. Specifically, when the positional precision is ±5 μm, a transparent electrode made of an ITO ink or the like has to be used for the wiring of the n-side electrode 66 on a light-emitting surface side in order to suppress a variance in light extraction efficiency derived from a positional deviation of a micro light-emitting diode. In the third embodiment, since the positional precision can be set to ±1.5 μm, even when a metallic wiring that can be readily formed is adopted as the wiring of the n-side electrode 66, the variance in the extraction efficiency can be confined to a permissible range. Specifically, since the transparent electrode made of the ITO ink or the like need not be used for the wiring of the n-side electrode 66, the wiring of the n-side electrode 66 can be readily formed.

Moreover, conventionally, the end surface 64 is covered with a resin layer in order to protect the end surface 64 of the n-type semiconductor layer 61, active layer 62, and p-type semiconductor layer 63. If the p-side electrode 65 and n-side electrode 66 are wired with the interface between the resin layer and end surface 64 exposed, a short circuit or any other fault may occur because of the poor adherence between the resin layer and end surface 64. Consequently, conventionally, for example, the resin layer has to be formed to be so thick as to cover the entire end surface 64 and p-side electrode 65 alike, and a contact via or an equivalent to be used to bring the wiring into contact with the end surface has to be formed in the resin layer, so that the interface between the resin layer and end surface 64 will not be exposed. At this time, when the positional precision of a micro light-emitting diode is ±5 μm, such strict restrictions that a positional deviation of a contact via should be ±2 μm and the diameter of the contact via should be equal to or smaller than 6 μm have to be imposed for fear the interface between the resin layer and end surface 64 may be exposed. In contrast, according to the third embodiment, for example, when the positional precision of a micro light-emitting diode is ±1.5 μm, for example, a design signifying that the positional deviation of a contact via is ±3 μm and the diameter of the contact via is equal to or smaller than 11 μm can be achieved. Designing can be very easy to do.

As mentioned above, when the positional precision of a micro light-emitting diode is ±5 μm, it is hard to form a contact via with a positional deviation of ±2 μm and a via diameter of 6 μm or less. As an alternative structure, a bump has to be formed on the p-side electrode 65. In contrast, according to the third embodiment, since the positional precision of a micro light-emitting diode can be set to, for example, ±1.5 μm, the contact via can be readily formed. Eventually, the bump formation step can be excluded.

Next, a mounting method for an element in accordance with the fourth embodiment of the present invention will be described below.

FIG. 11 to FIG. 13 show the mounting method for an element in accordance with the fourth embodiment.

In the fourth embodiment, first, similarly to the first embodiment, as shown in FIG. 11(A), an element 13 is mounted in a first part 12a of an element holding layer 12 made of a material whose viscosity can be controlled, and autonomously aligned. Thereafter, the first part 12a is cured.

Thereafter, as shown in FIG. 11(B), similarly to the first embodiment, a second element holding layer 12 is formed to entirely cover the element 13 and element holding layer 12.

Thereafter, as shown in FIG. 12(A), similarly to the first embodiment, the viscosity of the first part 12a of the second element holding layer 12 is controlled into a viscosity making an element to be mounted naturally movable, and the second part 12b of the element holding layer 12 is selectively cured to have a viscosity making the element naturally immovable. In FIG. 12(A), the position of the first part 12a of the second element holding layer 12 squares with the position of the first part 12a of the first element holding layer 12. However, the positions may not square with each other.

Thereafter, as shown in FIG. 12(B), an element 14 is embedded and mounted in the first part 12a of the second element holding layer 12. The element 14 may be of the same type as the element 13 or may be of a different type from the element 13. After a certain time elapses, as shown in FIG. 13, the element 14 is autonomously aligned with the first part 12a. Thereafter, the first part 12a is cured.

As mentioned above, the elements 13 and 14 can be arrayed in two steps.

The foregoing process is repeatedly implemented a required number of times, whereby elements can be arrayed in multiple steps.

According to the fourth embodiment, a mounted structure having multiple elements mounted three-dimensionally with high positional precision can be readily obtained.

The embodiments of the present invention have been concretely described so far. The present invention is not limited to the foregoing embodiments, but various variants can be made based on the technological idea of the present invention.

For example, the numerical values, materials, constitutions, structures, shapes, substrates, raw materials, and processes presented in relation to the first to third embodiments are mere examples. If necessary, different numerical values, materials, constitutions, structures, shapes, substrates, raw materials, and processes may be adopted.

According to the present invention, when an object such as an element, or more particularly, a microscopic object is mounted on a substrate, the mounting can be achieved readily and reliably with high positional precision. Using the mounting method, various pieces of high-performance electronic equipment and a high-performance light-emitting diode display can be readily realized.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A mounting method comprising:
   forming an object holding layer, which is made of a material whose viscosity can be controlled, on a substrate;
   controlling the viscosity of a first part of the object holding layer, which includes a mounting region for an object, into a viscosity making the object naturally movable, and controlling the viscosity of a second part of the object holding layer outside the first part into a viscosity higher than the viscosity of the first part;
   mounting at least one object in the first part such that the at least one object is naturally movable therein; and
   after mounting the object in the first part, controlling the viscosity of the first part into a viscosity making the object naturally immovable.

2. The mounting method according to claim 1 further comprising after mounting the object in the first part, lowering the viscosity of the first part before controlling the viscosity of the first part into the viscosity making the object immovable.

3. The mounting method according to claim 1, wherein the first part is surrounded by the second part.

4. The mounting method according to claim 1, wherein one object is mounted in the first part.

5. The mounting method according to claim 4, wherein a planar shape of the first part is analogous to a planar shape of the object.

6. The mounting method according to claim 4, wherein assuming that the area of the first part is S1 and the area of the bottom of the object is S2, 1<S1/S2<100 is established.

7. The mounting method according to claim 4, wherein assuming that the area of the first part is S1, the area of the bottom of the object is S2, the height of the object is t2, and the difference between the height of the bottom of the object and the height of the surface of the object holding layer after the object is mounted in the first part is d, $S1 \cdot d < (S1-S2) \cdot t2$ is established.

8. The mounting method according to claim 1, wherein the planar shape of the first part is rotationally symmetrical.

9. The mounting method according to claim 1, wherein the planar shape of the first part is circular or equilaterally polygonal.

10. The mounting method according to claim 1, wherein the object holding layer is a resin layer.

11. The mounting method according to claim 10, wherein the resin layer is made of a photosensitive resin, a thermosetting resin, or a thermoplastic resin.

12. The mounting method according to claim 1, wherein the mounting method further comprises a step of after controlling the viscosity of the first part into the viscosity making the object naturally immovable, controlling the viscosity of the first part into the viscosity making the object naturally movable.

13. The mounting method according to claim 1, wherein the viscosity making the object naturally movable is between 1 Pa·s and 1000 Pa·s.

14. The mounting method according to claim 13, wherein the viscosity of the first part is lowered to between 0.001 Pa·s and 10 Pa·s after mounting the object in the first part and before controlling the viscosity of the first part into the viscosity making the object immovable.

15. The mounting method according to claim 1, further comprising after mounting the object in the first part, heating the substrate before controlling the viscosity of the first part into the viscosity making the object immovable.

16. The mounting method according to claim 1, further comprising after mounting the object in the first part, applying an ultrasonic vibration to the substrate before controlling the viscosity of the first part into the viscosity making the object immovable.

17. A manufacturing method for electronic equipment comprising:
forming an element holding layer, which is made of a material for use in an electronic equipment and whose viscosity can be controlled, on a substrate;
controlling the viscosity of a first part of the element holding layer, which includes a mounting region for an element, into a viscosity making the element naturally movable, and controlling the viscosity of a second part of the element holding layer outside the first part into a viscosity higher than the viscosity of the first part;
mounting at least one element in the first part such that the at least one element is naturally movable therein; and
after mounting the element in the first part, controlling the viscosity of the first part into a viscosity making the element naturally immovable.

18. A manufacturing method for a light-emitting diode display, which has a plurality of red illuminant light-emitting diodes, a plurality of green illuminant light-emitting diodes, and a plurality of blue illuminant light-emitting diodes mounted on a substrate, the manufacturing method comprising:
forming an element holding layer, which is made of a material whose viscosity can be controlled, on a substrate;
controlling the viscosity of a first part of the element holding layer, which includes a mounting region for a light-emitting diode, into a viscosity making the light-emitting diode naturally movable, and controlling the viscosity of a second part of the element holding layer outside the first part into a viscosity higher than the viscosity of the first part;
mounting at least one light-emitting diode in the first part such that the at least one light-emitting diode is naturally movable therein; and
after mounting the light-emitting diode in the first part, controlling the viscosity of the first part into a viscosity making the light-emitting diode naturally immovable.

* * * * *